US009865660B2

(12) United States Patent
Wohlgenannt et al.

(10) Patent No.: US 9,865,660 B2
(45) Date of Patent: Jan. 9, 2018

(54) ORGANIC MAGNETOELECTROLUMINESCENCE FOR TRANSDUCTION BETWEEN MAGNETIC AND OPTICAL INFORMATION

(71) Applicants: UNIVERSITY OF IOWA RESEARCH FOUNDATION, Iowa City, IA (US); NEW YORK UNIVERSITY, New York, NY (US)

(72) Inventors: Markus Wohlgenannt, Iowa City, IA (US); Michael Flatte, Iowa City, IA (US); Andrew Kent, New York, NY (US); Fujian Wang, San Ramon, CA (US); Nicholas Harmon, Las Vegas, NV (US); Ferran Macia Bros, Sabadell (ES)

(73) Assignee: University of Iowa Research Foundation, Iowa City, IA (US)

( * ) Notice: Subject to any disclaimer, the term of this patent is extended or adjusted under 35 U.S.C. 154(b) by 24 days.

(21) Appl. No.: 14/834,770

(22) Filed: Aug. 25, 2015

(65) Prior Publication Data

US 2016/0197133 A1 Jul. 7, 2016

Related U.S. Application Data

(60) Provisional application No. 62/041,285, filed on Aug. 25, 2014.

(51) Int. Cl.
*H01L 29/82* (2006.01)
*H01L 27/32* (2006.01)
*H01L 51/52* (2006.01)
*G11C 13/00* (2006.01)
*G11C 13/04* (2006.01)
*H01L 51/50* (2006.01)
(Continued)

(52) U.S. Cl.
CPC ...... *H01L 27/3225* (2013.01); *G11C 11/1673* (2013.01); *G11C 13/0014* (2013.01); *G11C 13/043* (2013.01); *H01L 51/5012* (2013.01); *H01L 51/52* (2013.01); *G11C 11/1675* (2013.01); *H01L 43/08* (2013.01)

(58) Field of Classification Search
CPC ............ H01L 27/3225; G11C 11/1673; G11C 13/0014
USPC .................................. 257/421, 414, 422, 40
See application file for complete search history.

(56) References Cited

U.S. PATENT DOCUMENTS 5,652,445 A * 7/1997 Johnson .................. G11C 11/16 257/295
5,654,566 A * 8/1997 Johnson .................. G11C 11/16 257/295

(Continued)

*Primary Examiner* — Lex Malsawma
*Assistant Examiner* — Eric W Jones
(74) *Attorney, Agent, or Firm* — Smith, Gambrell & Russell

(57) ABSTRACT

An optoelectronic device which can read magnetically stored information, and convert it into optical light signals using organic or "plastic" semiconductors is described. Such a device may use OLEDs, and may be termed an "organic magneto-optic transducer" (OMOT). An OMOT device can read magnetically stored information, and convert it into optical light signals. The OMOT may provide benefits such as non-volatile storage, flexible films, reduced cost, and operation at room temperature.

6 Claims, 16 Drawing Sheets

(51) Int. Cl.
*H01L 43/08* (2006.01)
*G11C 11/16* (2006.01)

(56) References Cited

U.S. PATENT DOCUMENTS

| | | | | |
|---|---|---|---|---|
| 6,956,269 | B1* | 10/2005 | Vashchenko | H01L 29/66984 257/252 |
| 7,309,888 | B2* | 12/2007 | Johnson | G01R 33/06 257/295 |
| 7,626,236 | B2* | 12/2009 | Datta | H01L 29/66984 257/410 |
| 7,960,757 | B2* | 6/2011 | B A Jalil | H01L 29/66984 257/194 |
| 8,476,721 | B2* | 7/2013 | Li | H01L 27/11521 257/295 |
| 8,748,957 | B2* | 6/2014 | Kelber | H01L 29/66984 257/29 |
| 8,933,909 | B2* | 1/2015 | Giddings | G06F 3/0412 324/252 |
| 2003/0001154 | A1* | 1/2003 | Epstein | B82Y 10/00 257/40 |
| 2005/0057986 | A1* | 3/2005 | Johnson | G11C 11/16 365/202 |
| 2006/0091991 | A1* | 5/2006 | Wohlgenannt | G01R 33/09 338/13 |
| 2007/0082230 | A1* | 4/2007 | Shi | B82Y 10/00 428/811 |
| 2008/0152952 | A1* | 6/2008 | Santos | B82Y 25/00 428/811.1 |
| 2008/0193793 | A1* | 8/2008 | Johannes | C07C 255/42 428/690 |
| 2009/0004759 | A1* | 1/2009 | Ahn | C23C 16/40 438/3 |
| 2009/0179216 | A1* | 7/2009 | Xuan | H01L 33/0004 257/98 |
| 2010/0080047 | A1* | 4/2010 | Liu | B82Y 25/00 365/157 |
| 2010/0096617 | A1* | 4/2010 | Shanks | C09K 19/2028 257/13 |
| 2010/0109712 | A1* | 5/2010 | Zaliznyak | B82Y 25/00 327/100 |
| 2010/0195381 | A1* | 8/2010 | Karg | G11C 11/16 365/171 |
| 2011/0114924 | A1* | 5/2011 | Aurongzeb | H01L 51/0083 257/40 |
| 2012/0315714 | A1* | 12/2012 | Shanks | C09K 19/2028 438/29 |
| 2013/0095327 | A1* | 4/2013 | Vardeny | B82Y 25/00 428/419 |
| 2014/0184485 | A1* | 7/2014 | Kim | G09G 3/3406 345/102 |
| 2015/0162557 | A1* | 6/2015 | Vardeny | H01L 51/52 257/40 |
| 2016/0169988 | A1* | 6/2016 | Sirringhaus | G01R 33/1284 324/251 |

* cited by examiner

ORGANIC MAGNETOELECTROLUMINESCENCE FOR TRANSDUCTION BETWEEN MAGNETIC AND OPTICAL INFORMATION

ACKNOWLEDGE OF GOVERNMENT INTEREST

This invention was made with funding from United States Army grant number W911NF-08-1-0317. The government has rights in this invention.

BACKGROUND OF THE INVENTION

1. Field of the Invention

The present invention relates to an optoelectronic device which can read magnetically stored information, and convert it into optical light signals using organic or "plastic" semiconductors.

2. Description of the Related Art

A number of significant technologies have been developed along generally independent lines. For example, Magnetic storage (or magnetic recording) is the storage of data on a magnetized medium. Magnetic storage uses different patterns of magnetization in a magnetizable material to store data and is a form of non-volatile memory. Magnetic storage media, such as hard disks, are widely used to store computer data as well as audio and video signals. Another example of magnetic storage is magnetic stripes on credit cards.

Another example is optical data communications. Data can be efficiently transferred over long distances by optical means. A prime example is fiber-optic communication, which is a method of transmitting information from one place to another by sending pulses of light through an optical fiber.

Likewise, organic or "plastic" semiconductor devices have become a ubiquitous lighting and display technology (such as organic light-emitting diodes, OLEDs) owing to their flexibility, inexpensive character, and highly efficient light output. A typical OLED is shown in FIG. 1. Such an OLED is an electronic device made by placing a series of organic thin films between two conductors. When electrical current is applied, a bright light is emitted. OLEDs may be utilized in a number of forms, such as active matrix, transparent, top-emitting, flexible, and white OLEDs. OLEDs and LEDs use the same principle of electroluminescence—the optical and electrical phenomenon where certain materials emit light in response to an electric current passing through it.

Organic information processing also occupies an important niche, where computational speed is less important than flexibility or cost. Nonvolatile information storage in organic electronics poses a challenge, as organic semiconductor flash memory currently has high leakage currents.

A significant benefit may be obtained by combining these technologies. However, conventional approaches for integrating optical and magnetic devices rely on magneto-optical effects and do not work for organic semiconductors.

A need arises for effective techniques for integrating organic optical devices and magnetic devices, particularly in terms of less expensive, non-volatile electronics for data storage and processing.

SUMMARY OF THE INVENTION

The present invention may provide improved and effective techniques for integrating organic optical devices and magnetic devices, particularly in terms of less expensive, non-volatile electronics for data storage and processing. In one embodiment, the present invention relates to an optoelectronic device which can read magnetically stored information, and convert it into optical light signals. Since such a device uses OLEDs, the device may be termed an "organic magneto-optic transducer" (OMOT). An OMOT device can read magnetically stored information, and convert it into optical light signals. The OMOT may provide benefits such as non-volatile storage, flexible films, reduced cost, and operation at room temperature.

The light emitted by the OLED is modulated by the magnetic field emitted from a magnetized bit of the magnetic storage medium. The magneto-optic coupling is through a new, previously unexplored mechanism in which room temperature information transduction between a magnet and an organic light-emitting diode is achieved that does not require electrical current. This technique involves controlling the electroluminescence of an organic film at room temperature, using the spatially-varying magnetic fringe fields of a magnetically-unsaturated ferromagnet. This invention relates to an optoelectronic device which can read magnetically stored information, and convert it into optical light signals. Potential applications may include computer data storage and processing and magnetic field sensors. A particular example is using the effect as buffer memory in display screens. The organic memory cell, which can be integrated directly into each light emitting pixel of the screen, can be written by the magnetic field surrounding an electrical wire close to the cell. The writing current can now be removed, and the memory cell stores the information in a non-volatile way. This storage functionality would be used, at any desired moment of time, to convert the content of this buffer memory into light emitted by the pixel that is part of the display using the transistors of an active matrix array.

For example, the storage and power consumption of conventional organic field-effect transistor (OFET) based computing devices aren't all that efficient, and current transistor densities are too low to build usable amounts of RAM or non-volatile NAND flash on a plastic substrate. In one embodiment, the present invention may use a thin magnetic foil that stores high-density data, much like a hard drive platter, and transducing (converting) magnetic data, stored on the magnetic foil, into optical data emitted by an organic LED. Using a magnetoelectroluminescent compound in the OLED, the transduction may be performed without an external power source. The magnetic fields of the bits stored on the foil are enough to modulate the OLED into emitting more or fewer photons. This optical data may then be transported using a communication medium such as optical fiber. In one embodiment, the present invention may be advantageously utilized in storage and communication for new types of inexpensive, low-power computers based on conducting plastics. In one embodiment, the present invention may be advantageously utilized in high-capacity storage devices that use high-speed optical buses.

DETAILED DESCRIPTION OF THE INVENTION

Figure 1:
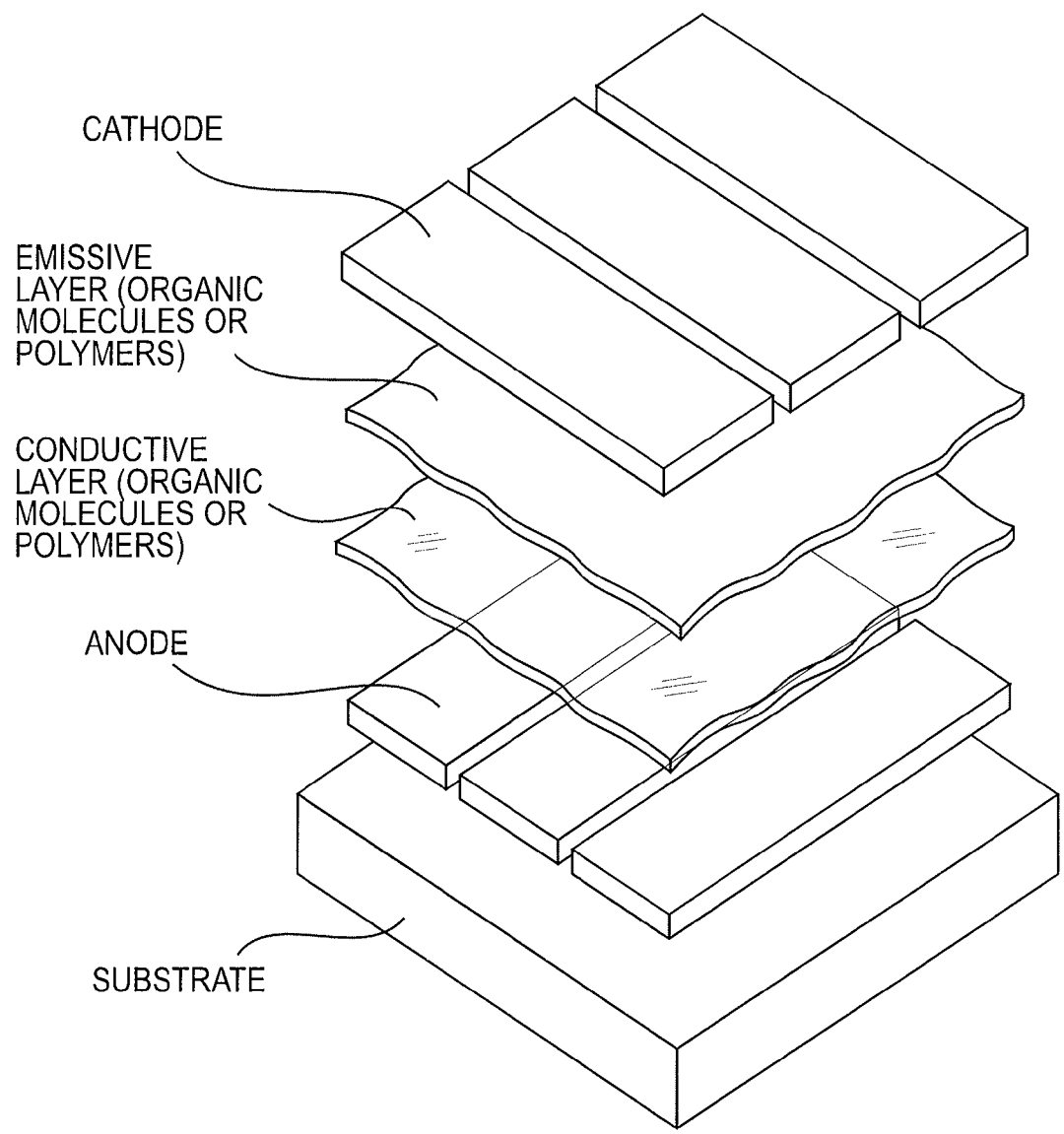
FIG. 1 is an exemplary diagram of the structure of a typical conventional OLED.

Magnetic and spin-based technologies for data storage and processing provide unique challenges for information transduction to light because of magnetic metals' optical loss, and the inefficiency and resistivity of semiconductor spin-based emitters at room temperature. Transduction between magnetic and optical information in typical organic semiconductors poses additional challenges, as the spin-orbit interaction is weak and spin injection from magnetic electrodes has been limited to low temperature and low polarization efficiency. In one embodiment, the present invention utilizes room temperature information transduction between a magnet and an organic light-emitting diode that does not require electrical current, based on control via the magnet's remanent field of the exciton recombination process in the organic semiconductor. This behavior may be explained quantitatively within a theory of spin-dependent exciton recombination in the organic semiconductor, driven primarily by gradients in the remanent fringe fields of a few nanometer-thick magnetic film.

Organic semiconductor sandwich devices, used for example in organic light-emitting diodes (OLEDs), consist of a thin film of an organic semiconductor (or several layers thereof) sandwiched between a bottom and top electrode. The organic semiconductor is typically intrinsic, and is essentially void of charge carriers. Therefore one of the electrodes is chosen to efficiently inject electrons, and the other to efficiently inject holes. For this purpose low and high work function metals, respectively, are chosen. Recombination of these electron-hole pairs leads to electroluminescence (EL) in the OLED. Nonvolatile information storage in organic electronics poses a challenge, as organic semiconductor flash memory currently has high leakage currents owing to the large electric fields required to change the transport properties of organic semiconductors. (Sekitani, T. et al. Organic nonvolatile memory transistors for flexible sensor arrays. Science 326, 1516-1519 (2009).) The non-volatility, speed, and low energy consumption of the magnetic memory make it fundamentally attractive for integration with organics.

Typical approaches for integrating optical and magnetic devices rely on magneto-optical effects, which require a strong spin-orbit interaction that most organic materials lack. (Naber, W. J. M., Faez, S. & van der Wiel, W. G. Organic spintronics. J. Phys. D Appl. Phys. 40, R205-R228 (2007); Vardeny, Z. V. (ed.) Organic Spintronics (CRC, Heidelberg, 2010).) Use of spin injection provides a way to control the optical emission of an OLED, taking advantage of a spin-dependent exciton recombination process (Dediu, V., Murgia, M., Matacotta, F. C., Taliani, C. & Barbanera, S. Room temperature spin polarized injection in organic semiconductor. Solid State Commun. 122, 181-184 (2002); Davis, A. H. & Bussmann, K. Organic luminescent devices and magnetoelectronics. J. Appl. Phys. 93, 7358-7360 (2003); Nguyen, T. D., Ehrenfreund, E. & Vardeny, Z. V. Spin-polarized light-emitting diode based on an organic bipolar spin valve. Science 337, 204-209 (2012).), although magnetic metals have large impedance mismatches with organics. This impedance mismatch can be overcome using coupling through a magnet's fringe field at zero applied field (remanent field) as demonstrated in organic electronic devices. (Wang, Fujian, Macià, Ferran, Wohlgenannt, Markus, Kent, Andrew D. & Flatté, Michael E. Magnetic fringe-field control of electronic transport in an organic film. Phys. Rev. X 2, 021013 (2012); Macià, F. et al. Hysteretic control of organic conductance due to remanent magnetic fringe fields. Appl. Phys. Lett. 102, 042408 (2013); Harmon, N. J. et al. Including fringe fields from a nearby ferromagnet in a percolation theory of organic magnetoresistance. Phys. Rev. B 87, 121203 (2013).) Efficient coupling via the magnet's remanent field between light emission in organic devices and a magnetic memory would broaden the range of applicability of flexible, inexpensive organic electronics.

External magnetic field effects on the conductivity and luminescence of an organic film are already known. Transport of the injected carriers through the organic film occurs via a sequence of hops along a path connecting the top electrode to the bottom electrode, and the rate of transport and/or recombination is markedly affected by variations in the local magnetic field along the path, as found in numerous experimental and theoretical studies (Kalinowski, J., Cocchi, M., Virgili, D., Di Marco, P. & Fattori, V. Magnetic field effects on emission and current in Alq(3)-based electroluminescent diodes. Chem. Phys. Lett. 380, 710-715 (2003); Francis, T. L., Mermer, O., Veeraraghavan, G. & Wohlgenannt, M. Large magnetoresistance at room temperature in semiconducting polymer sandwich devices. New. J. Phys.

6, 185 (2004); Prigodin, V. N., Bergeson, J. D., Lincoln, D. M. & Epstein, A. J. Anomalous room temperature magnetoresistance in organic semiconductors. *Synth. Met.* 156, 757-761 (2006); Bobbert, P. A., Nguyen, T. D., van Oost, F. W. A., Koopmans, B. & Wohlgenannt, M. Bipolaron mechanism for organic magnetoresistance. *Phys. Rev. Lett.* 99, 216801 (2007); Desai, P. et al. Magnetoresistance and efficiency measurements of Alq(3)-based OLEDs. *Phys. Rev. B* 75, 094423 (2007); Hu, B. & Wu, Y. Tuning magnetoresistance between positive and negative values in organic semiconductors. *Nat. Mater.* 6, 985-991 (2007).) In the transport regime, this effect is known as organic magnetoresistance (OMAR), and for light emission it is denoted as organic magnetoelectroluminescence (OMEL) Typically the source of the inhomogeneous field is the nuclear hyperfine field, which is random and spatially uncorrelated. The origin of OMAR can be traced back to interactions between paramagnetic charge pairs that occur at bottle-neck sites (sites that crucially affect the transport and/or electroluminescent properties). These interactions are often spin selective, and the reaction rate depends on the angle between the local spin quantization axis (provided by the local magnetic field) for the two paramagnetic species. An applied magnetic field exceeding the hyperfine field strength forces this angle to be close to zero everywhere in the film, which shows up as magnetoconductance (MC) or magnetoelectroluminescence (MEL) The exact nature of the paramagnetic pairs remains hotly debated, and the possibilities include electron-hole pair recombination to form singlet or triplet excitons (see Prigodin), e-e or h-h recombination to form singlet bipolarons (see Bobbert) and collision reactions between electrons or holes with long lived triplet excitons (see Desai).

In one embodiment, the present invention utilizes the effect that the fringe field resulting from a magnetic film a few nanometers thick can be used to control the electroluminescent output of an OLED at room temperature. Large gradients in the magnitude of the random local field lead to fringe-field-driven MC and MEL, and devices were constructed that utilize fringe fields from an unsaturated magnetic film to supply such gradients (see Wang, Macià, and Harmon). Electrically insulated magnetic films prove that fringe fields, and not electrical currents, are responsible for the coupling between the ferromagnetic layer and the OMAR/OLED device. Such fringe-field effects are described herein, as are 'ordinary' OMAR and OMEL (based on, for example, hyperfine fields). As the fringe field MEL mechanism is driven by fringe-field gradients, independent of the mechanism of ordinary OMAR and OMEL, the effects described here should be found in organic materials independent of the mechanism of OMAR and OMEL, including in materials where there is no OMAR and OMEL (see Harmon). Further, the effects of fringe-field gradients on the spin-dependent exciton recombination in the OLED have been simulated, based on a simple model of the fringe-field gradients, and excellent quantitative agreement with the measurements was found. These results provide a concrete demonstration of the potential for transduction between magnetic and optical information using fringe-field effects on OLED emission.

Figure 2A:
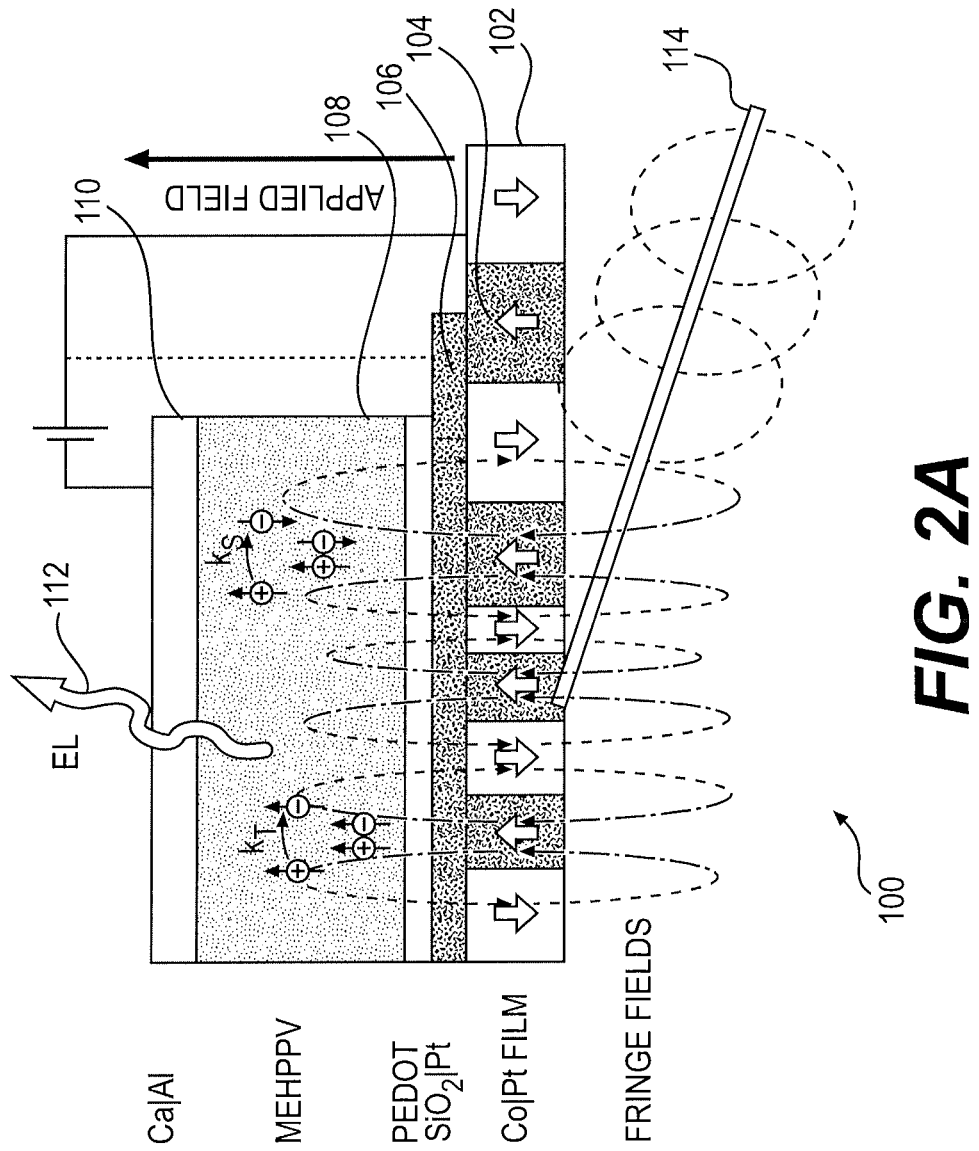
FIG. 2a is an exemplary schematic diagram of an embodiment a device structure that may provide fringe-field magnetoelectroluminescence (MEL).

Magnetic fringe-field effects on MC and MEL In one embodiment, the devices are OMAR/OLED devices fabricated on top of a ferromagnetic thin film, as shown in FIG. 2a. FIG. 2a shows an exemplary schematic of a device structure used for fringe-field MC and MEL measurements. The device 100 consists of a standard OMAR/OLED device fabricated on top of a ferromagnetic film, which need not be in electrical contact with the organic device. A $SiO_2$ layer was used in some devices to electrically isolate the magnetic film from the organic device. The electroluminescence (EL) is collected through the semitransparent top contact. It is to be noted that the device and fabrication technique shown in FIG. 2a is merely an example, the present invention contemplates a number of different devices and fabrication techniques.

In this embodiment, the device fabrication starts with the metal deposition of a ferromagnetic multilayered thin 102 film made of Cobalt (Co) and Platinum (Pt). Those films have perpendicular magnetic anisotropy; the spins tend to align in the direction orthogonal to the film plane. In presence of a large magnetic field out of the film plane, the Co|Pt films are uniformly magnetized with all the spins pointing opposite to the direction of the applied field. At lower fields, the films form magnetic domains—some regions with spins pointing up and others with spins pointing down—to lower the magnetostatic energy. These magnetic domains create strong, spatially varying fringe fields close to the surface of the Co|Pt films, which penetrate the OMAR/OLED device. In order to electrically insulate the OMAR/OLED device from the ferromagnetic film, a thin dielectric 104 is applied, followed by a conductive nonmagnetic layer 106 on top of the magnetic film. However, the strength and spatial correlation length of magnetic fringe fields depend sensitively on the distance from the magnetic film to the organic film. The insulating layer increases this distance, reducing the effect. As a result, devices without this layer show the largest effects, while devices with insulating layers rule out spin injection and tunneling anisotropic magnetoresistive effects.

A conducting polymer layer 106 (20 nm) of poly(3,4-ethylenedioxythiophene) poly(styrenesulphonate) (PEDOT: PSS, referred to as simply PEDOT from now on) was spin-coated from water suspension and serves as the hole-injecting layer. PEDOT is commonly employed for this purpose in OLED devices (Kim, W. H. et al. Molecular organic light-emitting diodes using highly conductive polymers as anodes. *Appl. Phys. Lett.* 80, 3844-3846 (2002).). Poly(2-methoxy-5-(2-ethylhexyloxy)-1,4-phenylenevinylene) (MEHPPV) was chosen as the luminescent polymer, as it is widely used as a red emitter in OLEDs (Malliaras, G. G., Salem, J. R., Brock, P. J. & Scott, C. Electrical characteristics and efficiency of single-layer organic light-emitting diodes". *Phys. Rev. B* 58, R13411-R13414 (1998).). The MEHPPV layer 108 (55 nm) was deposited by spin coating from toluene solution. Finally, calcium (Ca) 110 (6 nm, serving as the electron-injecting top contact) covered by aluminum 110 (Al) (12 nm) was deposited by vacuum evaporation through a shadow mask. In this example, the active device area is roughly 1 $mm^2$. The Al-capping layer is required to protect the highly reactive Ca layer. The contributions of the PEDOT and Ca electrodes to the device resistance (and magnetoresistance (MR)) are negligible, as they are metals, whereas MEHPPV is an intrinsic semiconductor. The EL 112 is measured through the semitransparent top electrode, and recorded by a photomultiplier tube. All measurements reported here are at room temperature.

An example of an application of the device shown in FIG. 2a is as buffer memory in display screens. The organic memory cell, which can be integrated directly into each light emitting pixel of the screen, can be written by the magnetic field surrounding an electrical wire 114 close to the cell. The writing current can now be removed, and the memory cell stores the information in a non-volatile way. This storage functionality would be used, at any desired moment of time, to convert the content of this buffer memory into light emitted by the pixel that is part of the display using the transistors of an active matrix array.

Figure 2B:
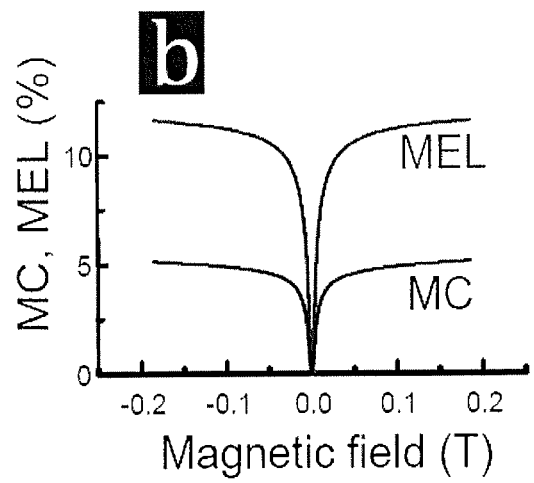
FIG. 2b is an exemplary trace of magnetoconductance (MC) and MEL responses to an external magnetic field of a reference OMAR/OLED device without a magnetic film.
Figure 2C:
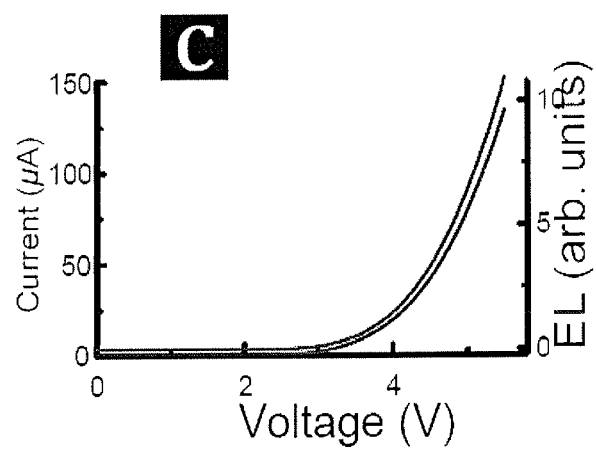
FIG. 2c shows exemplary current-voltage (IV) and EL curves for an exemplary organic device without a magnetic film.
Figure 2D:
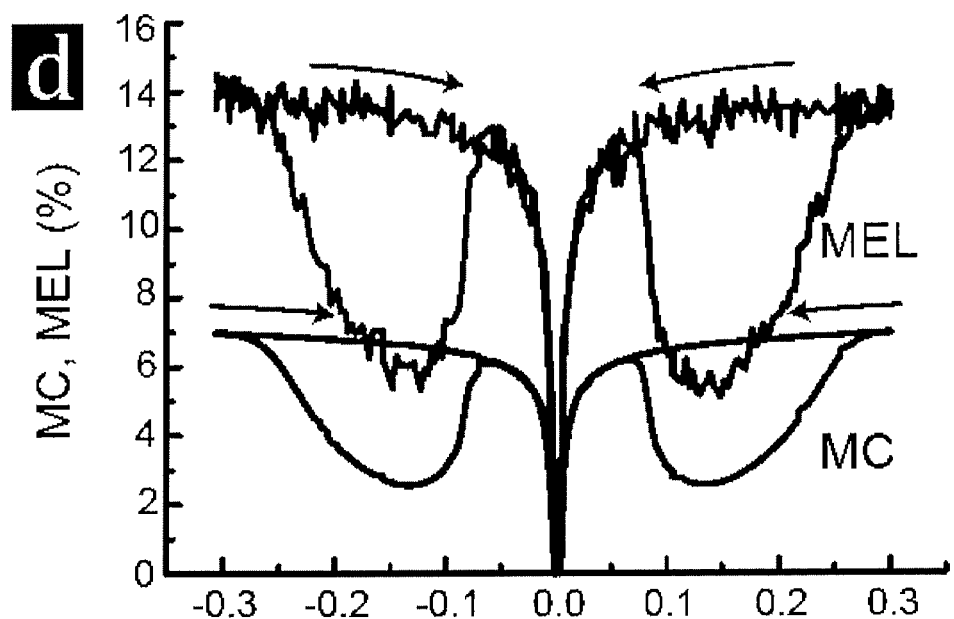
FIG. 2d shows exemplary measured MC and MEL curves responses of the complete exemplary organic fringe-field device.
Figure 2E:
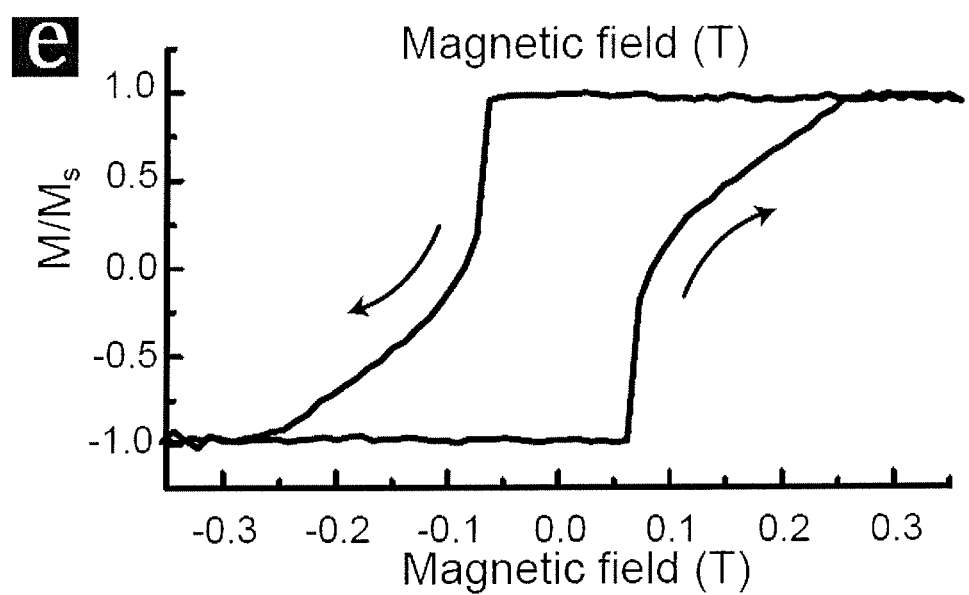
FIG. 2e shows an exemplary magnetization loop measured by magneto-optic Kerr effect (MOKE).
Figure 3A:
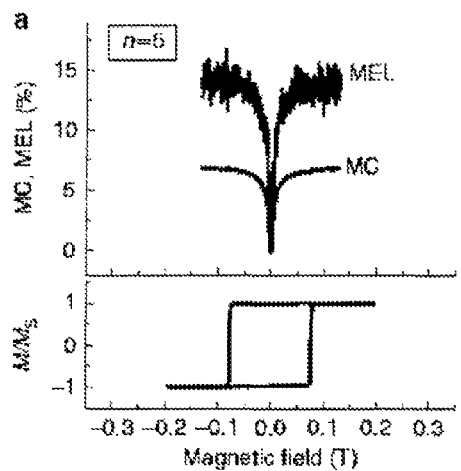
FIGS. 3a-d show exemplary MC and MEL responses of organic fringe field devices using different ferromagnetic films.
Figure 3B:
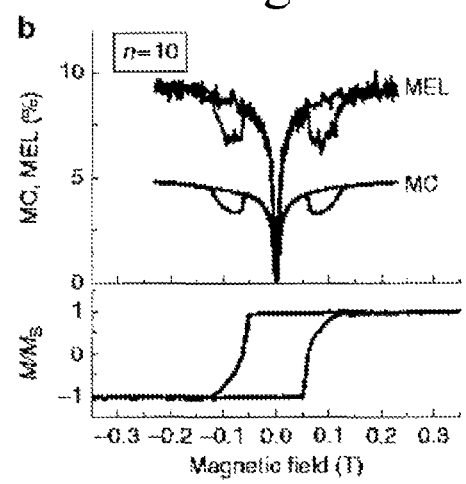
Figure 3C:
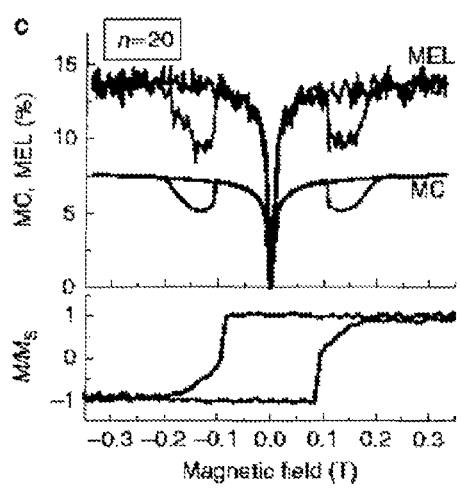
Figure 3D:
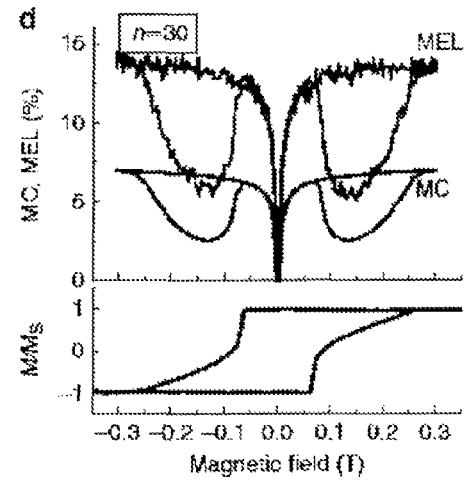

FIG. 2b shows a typical MC and MEL trace of responses to an external magnetic field of a reference OMAR/OLED device without the magnetic film, and FIG. 2c the current-voltage (IV) and EL curves, for an exemplary organic device without a magnetic film and whose MC/MEL is therefore caused by the random hyperfine fields, as described above. This device will serve as a reference when, later on, fringe-field-induced MC/MEL is described. It is seen that the hyperfine-induced MC and MEL responses have a magnitude of ≈5% and ≈10%, respectively, in the MEHPPV devices. The effects essentially saturate for applied fields in excess of 0.1 T, are non-hysteretic and have a full width at half maximum of ~20 mT. The effects are also independent of the direction of the applied magnetic field, and nearly independent of the MEHPPV layer thickness. In the present example, a thin MEHPPV layer (55 nm) is used such that the distance from the ferromagnetic film does not vary much between different locations in the MEHPPV film. Turning to the MC/MEL responses of the fringe-field OMAR devices, and the correlation between these effects and the film magnetization, M. FIG. 2d shows the measured MC and MEL curves responses of the complete exemplary organic fringe-field device, and FIG. 2e shows the magnetization loop measured by magneto-optic Kerr effect (MOKE). In these measurements, the magnetic field is applied perpendicularly to the device plane, and is swept smoothly from large negative to large positive fields and back (black lines). It is seen that the magnetization response is hysteretic, and that M assumes its saturation value MS for fields larger than B0.25 T in magnitude. M is unsaturated between roughly 0.05 and 0.25 T. The MC/MEL curves outside the unsaturated magnetization regime clearly mirror the data in nonmagnetic devices (panel b), and are explained by the 'normal' hyperfine OMAR effect. In the unsaturated region, the data curves develop characteristic 'ears'. These are the signature of fringe-field effects. A detailed experimental and theoretical characterization of the transport aspect of this effect has previously been given. 7-9. Here, it is demonstrated that fringe-field effects lead to a sizable room temperature MEL response, of up to 6% at room temperature for the present exemplary device. This can be comparable to MEL effects that occur only at low temperature, such as those recently reported in spin-valves (see Nguyen) and high magnetic field effects for OLEDs (Wang, J., Chepelianskii, A., Gao, F. & Greenham, N. C. Control of exciton spin statistics through spin polarization in organic optoelectronic devices. *Nat. Commun.* 3, 1191 (2012).).

Next, the relation between the magnetic film's response characteristics and MC/MEL is examined by fabricating exemplary OMAR/OLED devices on several different ferromagnetic electrodes. In these examples, the different magnetic responses are studied by fabricating ferromagnetic films consisting of Cobalt (Co) and Platinum (Pt) multilayers with a different number of repeats, n. We studied devices with n=5, 10, 20 and 30 (film thicknesses varied from 4 to 24 nm). The magnetization in the ferromagnetic films reverses through nucleation, growth, and annihilation of magnetic domains. When the magnetic films are saturated (all spins pointing towards the same direction) there are no magnetic fringe fields on top. When the magnetic films are unsaturated the strength of the magnetic fringe fields created by magnetic domains increases (almost linearly) with the thickness of the ferromagnetic layer (that is, with the number of repeats). Properties of Co|Pt ferromagnetic films have been characterized in detail (see Wang, Macià).

FIGS. 3a-d show MC and MEL responses of organic fringe field devices using different ferromagnetic films. The magnetic films are Co|Pt multilayers with a different number of Co|Pt repeats, n, resulting in different magnetization loops as evidenced by the MOKE M/MS. In all cases (a-d) the fringe-field response correlates exactly with the field range where the magnetic film is unsaturated, and therefore emits fringe fields into the organic device. The data in FIG. 3 shows that the hysteretic MR of the organic layer is directly correlated with the hysteretic magnetization of the ferromagnetic film. The fringe-field 'ears' occur only in the unsaturated regime, where the film's magnetization breaks into domains with fringe fields occurring near the domain boundaries.

Figure 4:
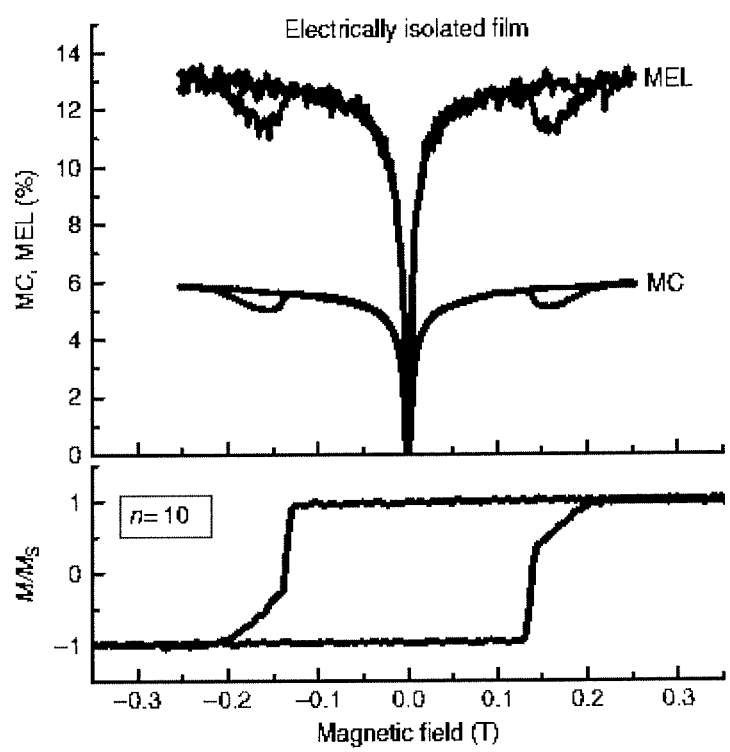
FIG. 4 shows exemplary results of a demonstration that the fringe-field effect is a result of magnetic, rather than electrical coupling.

Studies with electrically isolated magnetic films. FIG. 4 shows the results of a demonstration that the fringe-field effect is a result of magnetic, rather than electrical coupling. MC and MEL responses of an organic fringe-field device where the magnetic film is electrically isolated from the organic device by insertion of a $SiO_2$ layer between them. This control experiment is important for establishing the correct interpretation of the data, but results in a greater distance between magnetic film and organic device, leading to a smaller coupling between the two and a smaller fringe-field effect. FIG. 4 shows data similar to that reported in FIG. 3, but now for a device with an additional $SiO_2$ layer inserted between the magnetic film and the OMAR/OLED device. These data exhibit all the same characteristics of the data without the insulating layer, and prove that the coupling between the magnetic film and the organic device is magnetic rather than electrical in nature. In particular this excludes mechanisms such as tunneling anisotropic MR and spin-injection effects as the origin of the observed effects. The 'ears' are, however, significantly smaller in magnitude. This was to be expected, because the insulating layer leads to a significantly larger separation between the magnetic film and OMAR/OLED device as the overall spacer layer thickness increases from 20 to 45 nm with the layer inserted. We have previously examined 8 the dependence of the magnitude of the fringe-field MR on the spacer layer thickness.

Figure 5A:
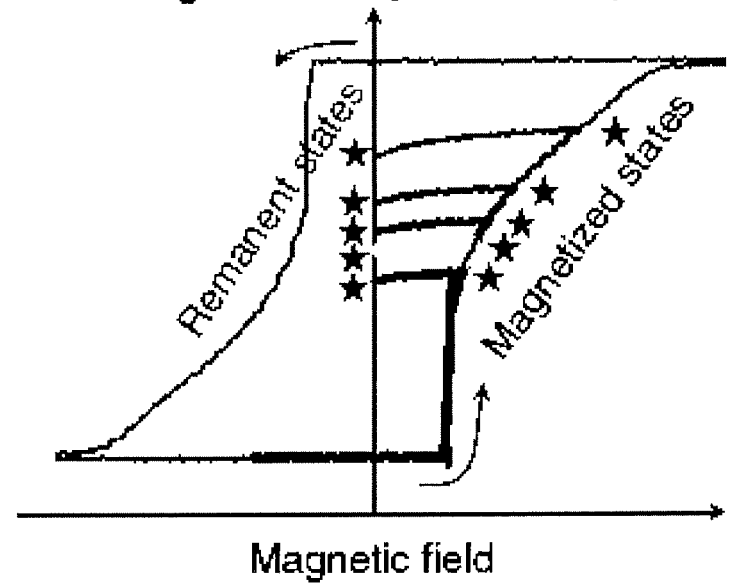
FIG. 5a shows an exemplary magnetic film hysteresis loop showing remanent states of the magnetic film.
Figure 5B:
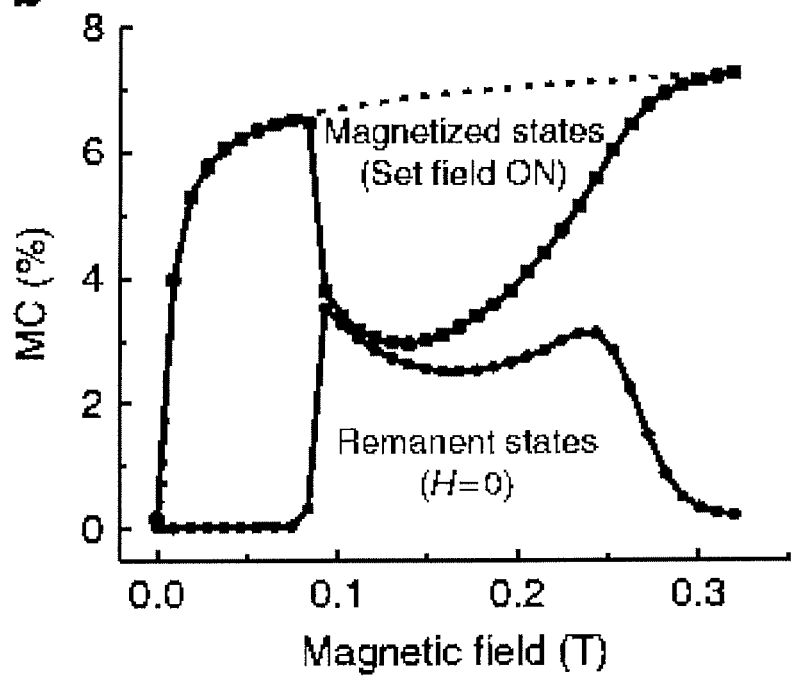
FIG. 5b shows an exemplary MC response of a 55-nm-thick MEHPPV film on top of a magnetic layer both in presence of and at zero magnetic field.

Control of EL with remanent fields. FIGS. 5a-d show a correlation between a remanent magnetic state of the magnetic film and the MC/MEL. In these measurements, the applied magnetic field plays an auxiliary role, and is used to write ('set') a particular remanent magnetic state, corresponding to a particular domain configuration and particular fringe-field pattern, and to erase ('reset') this configuration by replacing it with a saturated state without domains. This saturated state without domains is also used as the reference state against which we measure the MC and MEL percentage responses. Magnetic domains can be present at zero applied field in our magnetic films. Such remanent states are prepared by applying a perpendicular field close to the film's coercive field and then removing it (see FIG. 5a). Magnetization measurements and imaging prove that remanent domain states relax only slightly on removal of the field. Therefore, we have access to remanent magnetization states ranging from negative to positive saturation. At zero applied field, we observed how remanent fringe fields increase the conductance of the organic layer MEHPPV, suppressing OMAR. The same effect with a smaller strength was observed in the organic semiconductor $Alq_3$ (ref. 8). FIG. 5b shows MC and FIG. 5d shows and MEL of a 55-nm-thick MEHPPV film on top of a magnetic layer both in presence of and at zero magnetic field. The blue line depicts the measured values in presence of magnetic field, whereas the red lines trace the values measured after removing the applied field. Referring to the magnetization loop of an example magnetic film, FIG. 5a shows the procedure to set and reset different remanent states. The set field (blue star) is used to select a magnetic state. As the set field is being removed, the film remains in essentially the same state as evidenced by the only small amount of relaxation in magnetization between the write state (blue star) and remanent state (red star). The sample was first saturated with a large negative field, then we set a positive field value from 0 to 0.3 T and measured the conductivity of the organic layer (blue points) and then the applied field was removed and again measured the organic's conductivity (red points). Here it is shown that the electroluminescence increases up to 6% for remanent magnetic domain states of the ferromagnetic layer. In contrast to fringe fields from the same domain configuration in an applied magnetic field (near the coercive field), the MEL increases rather than decreases.

Theory of magnetic fringe-field effects on MC and MEL We now examine whether the large fringe-field effects observed in the MEL can be explained by theory. We consider a two-site model where an electron and hole (a polaron pair) occupy two nearby sites. The spin configuration of the polaron pair undergoes transitions due to the different magnetic interactions present; in our case these interactions consist of $$H_0 = \omega_0 \hat{z} \cdot (S_1 + S_2), H_{hf} = \omega_{hf_1} \cdot S_1 + \omega_{hf_2} \cdot S_2,$$

$$H_{ff} = \omega_{ff_1} S_1 + \omega_{ff_2} S_2,$$

which are the applied, hyperfine, and fringe-field Hamiltonians, respectively? The polaron pairs recombine into excitons at different rates, $k_S$ and $k_T$, depending on the pair's spin, as the singlet and triplet states have different energies and wavefunctions (Kersten, S. P., Schellekens, A. J., Koopmans, B. & Bobbert, P. A. Magnetic-field dependence of the electroluminescence of organic light-emitting diodes: competition between exciton formation and spin mixing. *Phys. Phys. Lett.* 106, 197402 (2011).) (See schematic FIG. 2a); alternatively the pair could disassociate at a rate $k_D$. Once an exciton is formed, the large exchange energy precludes any further spin evolution. In the absence of large spin-orbit interactions, spin selection rules dictate that exciton recombination (that is, photon emission) occurs only from the singlet exciton state. Assuming that radiative recombination is the only viable pathway for a newly formed singlet exciton, each singlet exciton will produce a single photon such that MEL can be defined in terms of $X_S$, the singlet fraction of excitons: $[X_S(B_0) - X_S(0)]/X_S(0)$.

To calculate the MEL, we employ the stochastic Liouville equation for the polaron pair spin density matrix, $\rho$ (Kubo, Ryogo Stochastic Liouville equations. *J. Math. Phys.* 4, 174-183 (1963); Haberkorn, R. Density matrix description of spin-selective radical pair reactions. *Mol. Phys.* 32, 1491-1493 (1976).):

$$\frac{\partial \rho}{\partial t} = -i[H_0 + H_{hf} + H_{ff}, \rho] - \frac{1}{2}\{k_S P_S + k_T P_{T}, \rho\} - k_D \rho,$$

where $P_S$ and $P_T$ are the singlet and triplet projection operators. The steady-state singlet and triplet exciton fractions are (Jones, J. A. & Hore, P. J. Spin-selective reactions of radical pairs act as quantum measurements. *Chem. Phys. Lett.* 488, 90-93 (2010).)

$$X_i = k_i \int_0^\infty Tr[P_i \rho(t)] dt,$$

where i runs over S and T All rates (times) are in units of the hyperfine field frequency (period), $\gamma_e B_{hf} (1/\gamma_e B_{hf})$ where $B_{hf}$ is the width of the Gaussian distribution of hyperfine fields. For simplicity we assume $\gamma_e = \gamma_h$ and $k_D = 0$.

To proceed with the calculation, one must have knowledge of the fringe fields present in the organic layer. In our previous analysis (see Harmon) on fringe-field-induced magnetoresistance, elementary magnetostatics were used to calculate fringe fields from X-ray magnetic circular dichroism (XMCD) images of the magnetic domains. The samples described herein have the same composition. We use therefore the statistical analysis from the aforementioned XMCD images to model the fringe-field distributions. Given the fact that fringe fields vanish at magnetic saturation and are largest and most varying at M=0, we model the fringe-field distribution as a normal distribution with mean zero and a field dependent standard deviation. Each component of the fringe-field ($B_{ff}$) gradient, $G_{ff}$, is modeled likewise. The field dependent standard deviations follow a parabola defined in the upper half-plane according to $$\sigma_{B_{ff_i}}(B_0) = -\frac{B_{ff_{max}}}{(B_L - B_C)^2}(B_0 - B_C)^2 + B_{ff_{max}},$$

$$\sigma_{G_{ff_i}}(B_0) = -\frac{G_{ff_{max}}}{(B_L - B_C)^2}(B_0 - B_C)^2 + G_{ff_{max}},$$

where $B_L$ is the field at which the magnet starts developing domains (obtainable from either the MOKE data or the MEL measurements) and $B_C$ is the field corresponding roughly to M=0. $B_{ff_{max}}$ and $G_{ff_{max}}$ mark the parabola's vertex and are the only free parameters. However, from analysis of samples of the same composition on which XMCD images have been acquired, their values are roughly 40 mT and 1 mT nm$^{-1}$, respectively, for a spacer width of 20 nm.

Figure 5C:
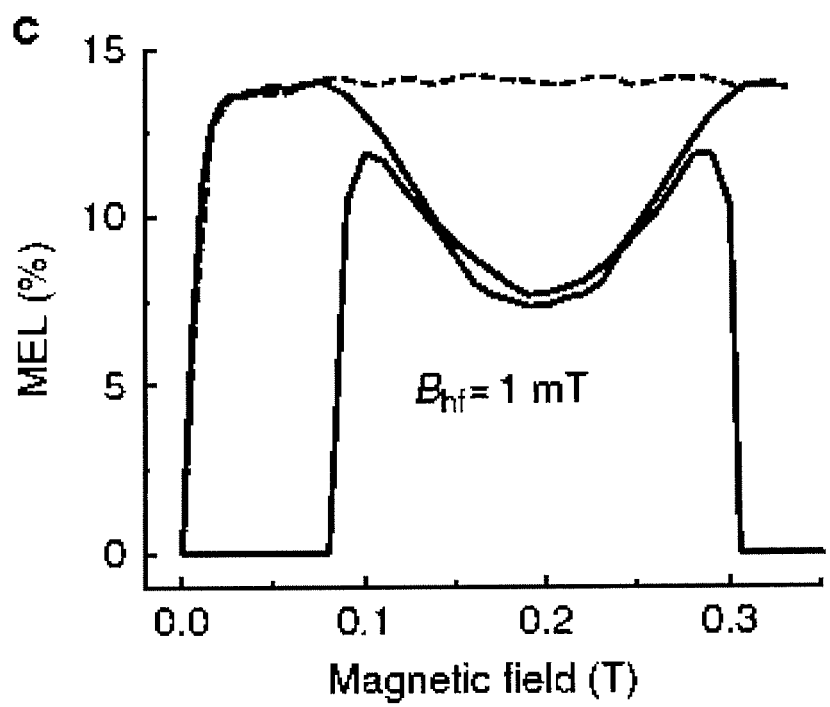
FIG. 5c shows an exemplary MEL response.
Figure 5D:
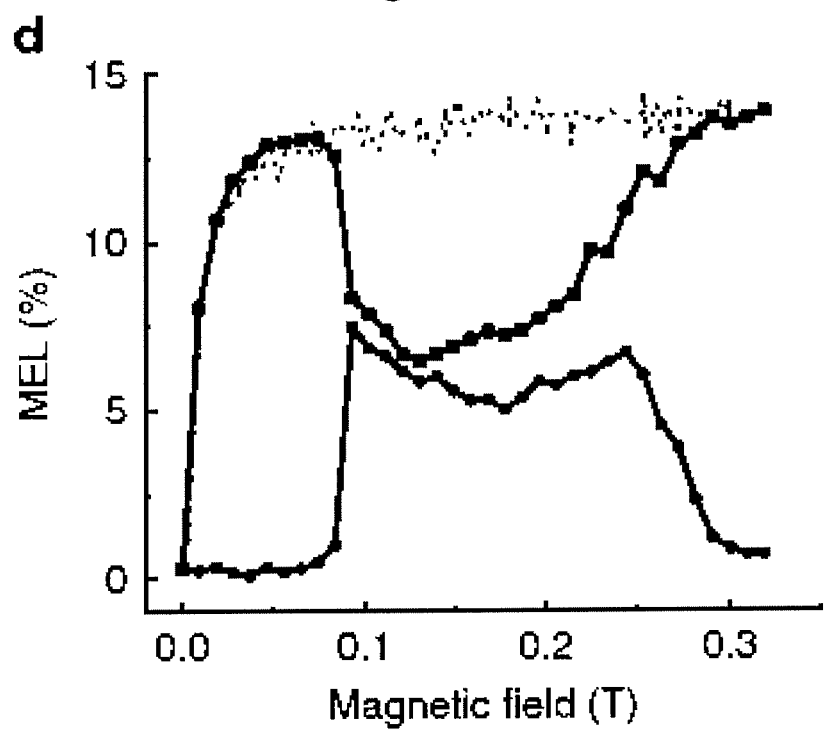
FIG. 5d shows an exemplary MEL response of a 55-nm-thick MEHPPV film on top of a magnetic layer both in presence of and at zero magnetic field.

The results of this theory and model are shown in FIG. 5c. The $B_L$ and $B_C$ are chosen from FIG. 2e. The values of $k_S(=1.5 \gamma_e B_{hf})$ and $k_T(=5 \gamma_e B_{hf})$ are chosen to achieve a saturated MEL percentage near that of FIG. 2d, ~14%. The values for the hopping rates fall into an intermediate hopping regime ($k_S \sim \gamma_e B_{hf}$) that produces a fringe-field effect.

Remanent fringe fields generated from the domain structure of the magnetic film cause the observed marked modification of the EL from an OLED at room temperature. As a uniform, perpendicularly magnetized film produces no remanent fields, the source of these fringe fields is the region where the magnetization changes most rapidly, corresponding to domain walls. The faster the magnetization changes, or the smaller the domain size, the larger the remanent fields. Thus this approach of interfacing magnetic information encoded in the domain structure with an OLED should become more effective and efficient as the magnetic domain sizes shrink. We note as well that the MEL is significantly larger than the MC, indicating that (for MEHPPV) fringe-field optical coupling and readout will have greater sensitivity than fringe-field electrical coupling and readout of magnetic information.

In one embodiment, an organic semiconductor semispin valve includes a ferromagnetic layer, a hole-injecting layer, an organic semiconductor, and a top electrode. The ferromagnetic electrode is a Co|Pt multilayer with the number of repeats varying from 5 to 30 deposited using electron-beam evaporation in ultra-high vacuum on oxidized Si wafers for device studies, and Si supported $Si_3N_4$ membranes for magnetic domain-imaging studies using an X-ray transmission microscope. Optical lithography is used to define lines in the ferromagnetic thin film. A hole-injecting layer, conducting polymer PEDOT:PSS, was deposited by spin coating from an aqueous suspension (suspension purchased from H. C. Starck, CLEVIO P VP AI 4083). A 55-nm-thick film of organic semiconductor MEHPPV (purchased from American Dye Source, Inc.) was deposited by spin coating with 3 mgml$^{-1}$ solution in toluene. The electron-injecting layer, Ca (6 nm) covered by Al (12 nm) was deposited by thermal evaporation at room temperature through a metal stencil to obtain a cross-point device geometry. The ferromagnetic electrodes were characterized by magnetic force microscopy, ferromagnetic resonance, vibrating sample magnetometry and MOKE.

MR measurements were done in a closed-cycle He cryostat positioned between the poles of an electromagnet. The measurements reported here are all at room temperature. MR measurements were performed using a Keithley 2400 sourcemeter. EL was measured using a photomultiplier tube through the top electrode Ca/Al. X-ray measurements were performed at the Advanced Light Source at the Lawrence Berkeley National Laboratory. Images were taken with a XM-1 zone-plate microscope at beamline 6.1.2.

Figure 6:
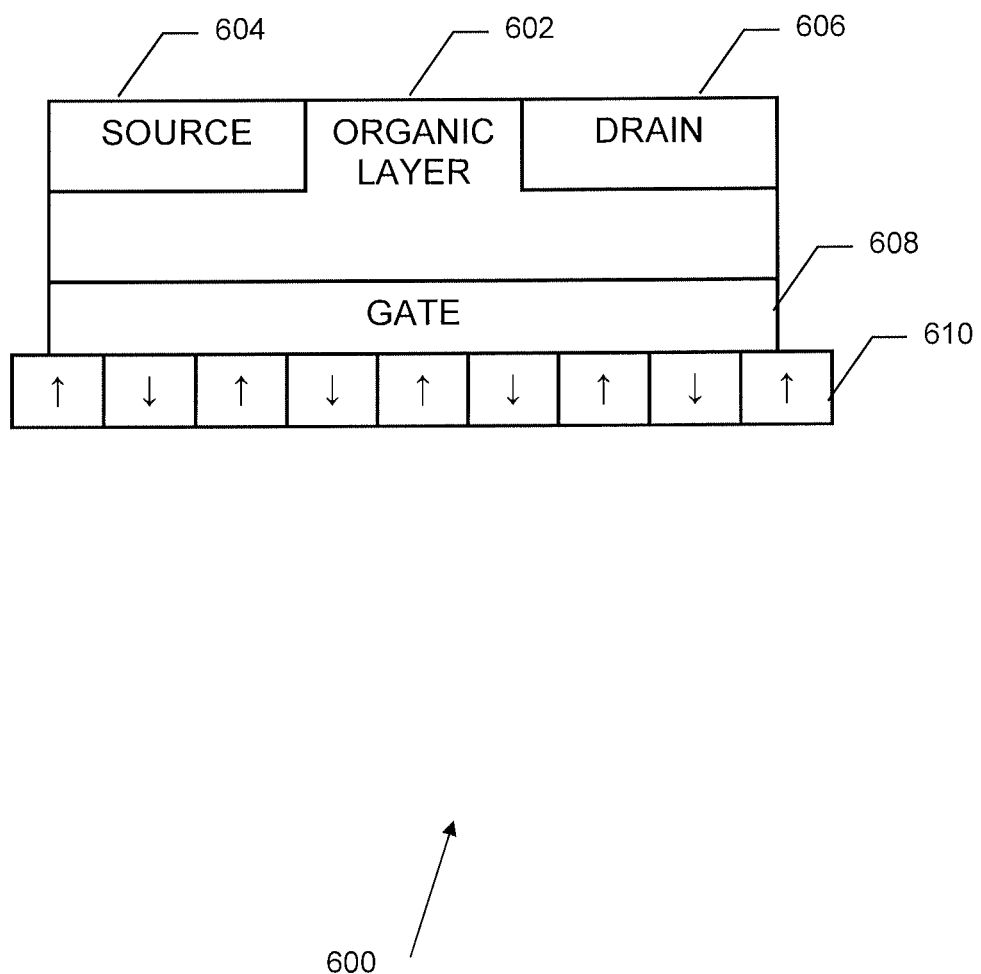
FIG. 6 is exemplary schematic diagram of an embodiment of a device that functions as an organic field-effect transistor controlled by a magnetic fringe-field emitted by a magnetic layer.

Additional embodiments and applications of the present invention may be found to be advantageously implemented. For example, an exemplary embodiment of an alternate or additional fringe-field device 600 is shown in FIG. 6. In this example, device 600 functions as an organic field-effect transistor. Device 600 includes an organic layer 602, with a source 604 and a drain 606 fabricated therein. Beneath the organic layer, a gate electrode 608 is fabricated, then a magnetic film layer 610 is fabricated below that. The configuration of device 600 is similar to the configuration of device 600, except that device 600 is three-terminal field-effect transistor, rather than a two-terminal OLED. In device 600, the fringe-field emitted by the magnetic layer 610 determines the electrical current that flows between the source 604 and drain 606 contacts of the transistor.

Figure 7A:
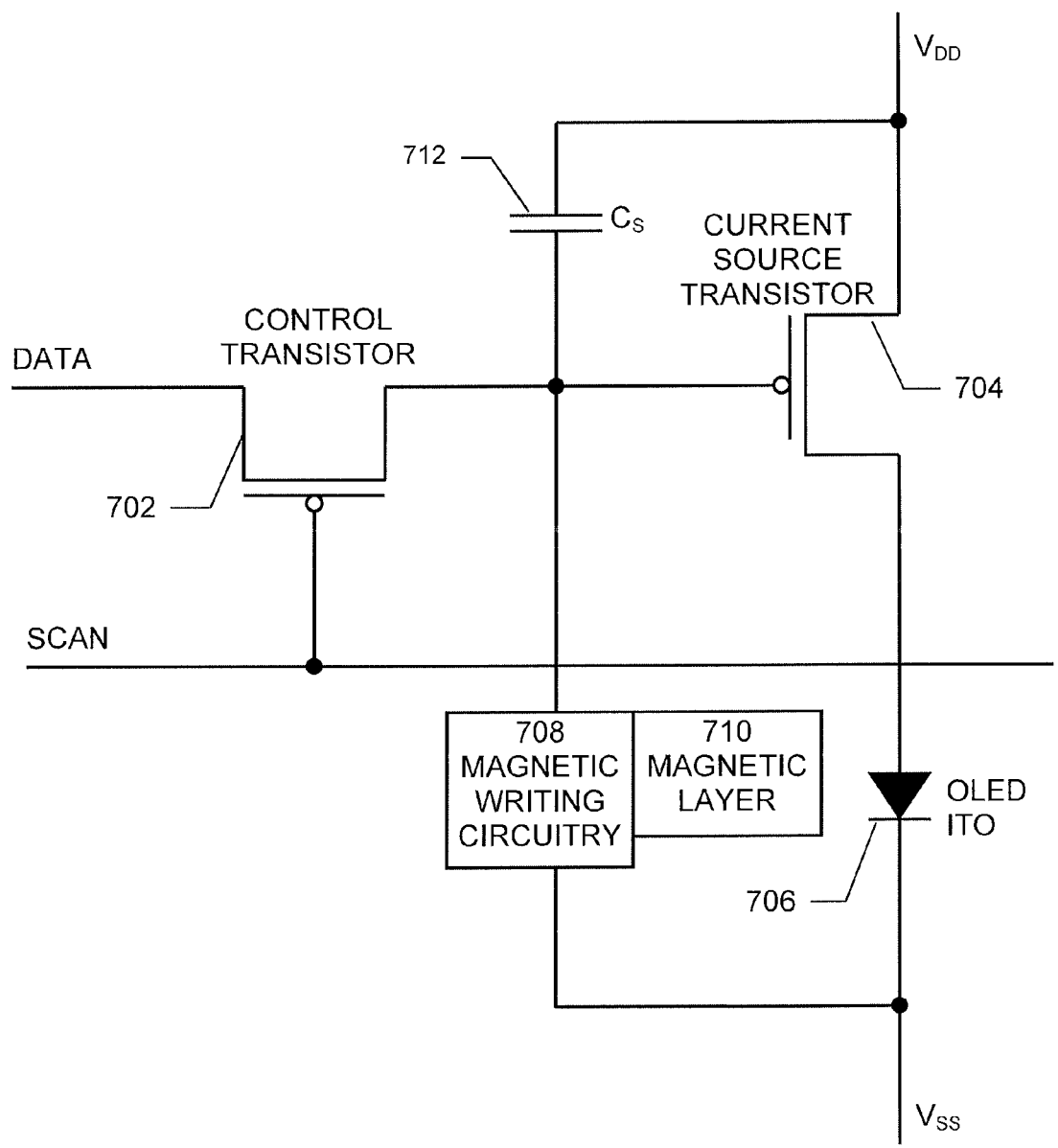
FIG. 7a is exemplary schematic diagram of an embodiment of an Active Matrix OLED pixel.

For example, an exemplary embodiment of an Active Matrix OLED pixel is shown in FIG. 7a. The circuit shown in this example includes a control transistor 702, a current source transistor 704, an OLED pixel 706, magnetic writing circuitry 708, a magnetic layer 710, and a storage capacitor $C_S$ 712. Control transistor 702 is used to turn on and off the pixel via current source transistor 704. This is a standard circuit used for active matrix displays (The complete display has one such circuit for each pixel). Storage capacitor $C_S$ 712 holds the current until the pixel is addressed again when the next frame is written. In the new active matrix embodiment shown in FIG. 7a, which includes a magnetic buffer memory (magnetic layer 710), $C_S$ 712 can be used for short term memory (valid for one refresh cycle) and the magnetic layer 710 can be used for non-volatile long-term buffer memory, or, alternatively, $C_S$ 712 can be eliminated altogether, and the magnetic layer 710 can serve as both short- and long-term buffer memory functions. Magnetic layer 710 and magnetic writing circuitry 708 have been added to the OLED pixel 706. Magnetic layer 710 directly modulates the light emitted by the pixel 706. Magnetic writing circuitry 708 controls the recording of magnetic domain patterns to magnetic layer 710.

Figure 7B:
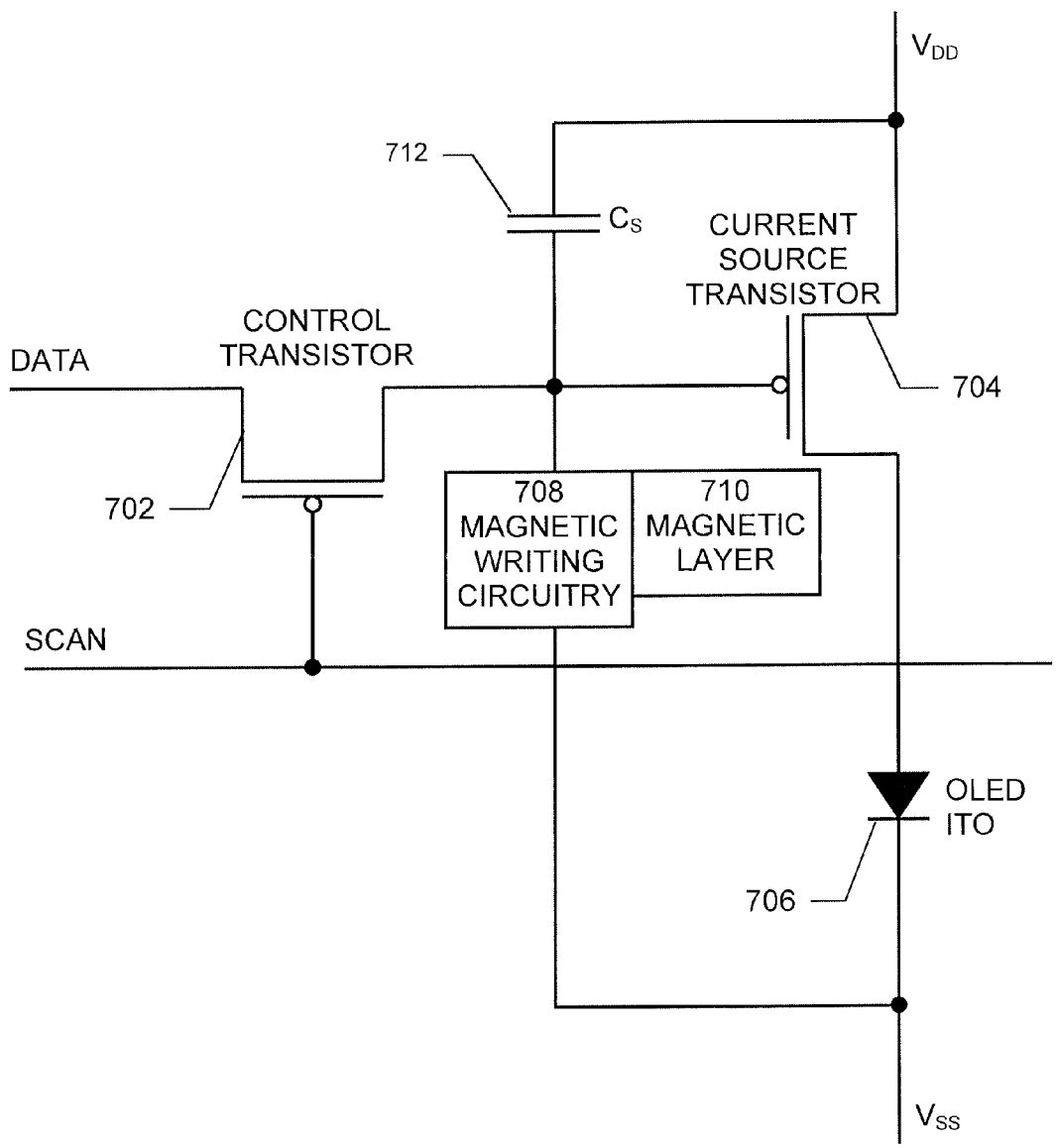
FIG. 7b is exemplary schematic diagram of an embodiment of an Active Matrix OLED pixel.

As another example, an exemplary embodiment of an Active Matrix OLED pixel is shown in FIG. 7b. The circuit shown in this example includes a control transistor 702, a current source transistor 704, an OLED pixel 706, magnetic writing circuitry 708, and a magnetic layer 710. Magnetic layer 710 and magnetic writing circuitry 708 have been added to the current source transistor 704. Magnetic layer 710 directly modulates the amount of current sent through the OLED pixel 706, which in turn determines its brightness. Magnetic writing circuitry 708 controls the recording of magnetic domain patterns to magnetic layer 710.

The examples shown in FIGS. 2a and 6 above utilize magnetic films with perpendicular magnetization; that is the magnetic domains are magnetized perpendicularly to a surface of the magnetic film. An example of perpendicular magnetization similar to those described above is shown in FIG. 8a. However, other magnetization techniques may also be utilized. For example, magnetic domains that lie in plane and thus are parallel to the surface of the material may utilized. Two examples of parallel magnetization are shown in FIGS. 8b and 8c. FIG. 8b, shows an example of parallel (in plane) magnetization against (approximately perpendicular to) stripes of magnetic material. FIG. 8c, shows an example of parallel (in plane) magnetization with (approximately parallel to) stripes of magnetic material. In this example, perpendicular and parallel refer to orientation of magnetization with respect to film surface.

Figure 8A:
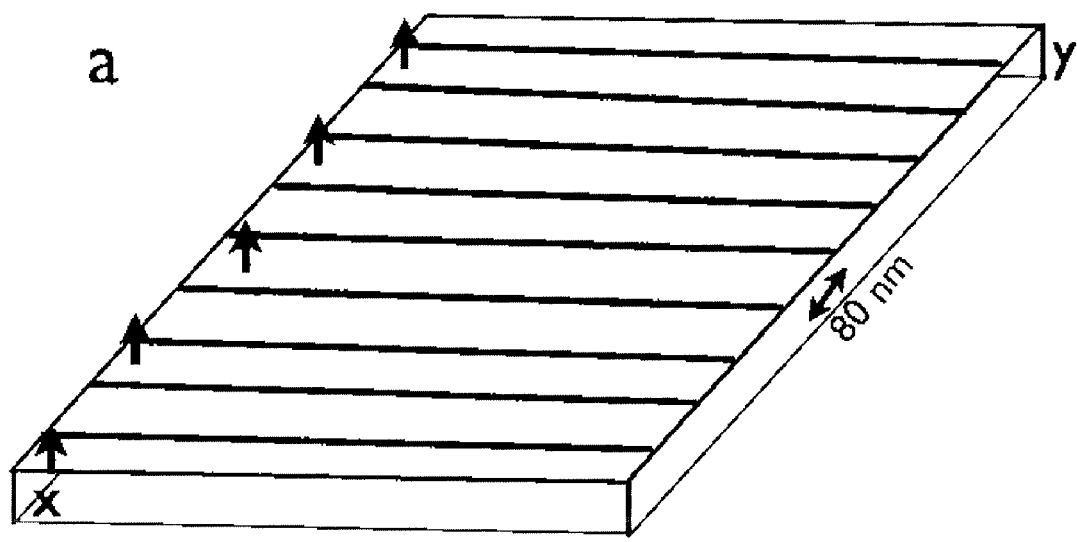
FIG. 8a is exemplary diagram of an embodiment of perpendicular magnetization.
Figure 8B:
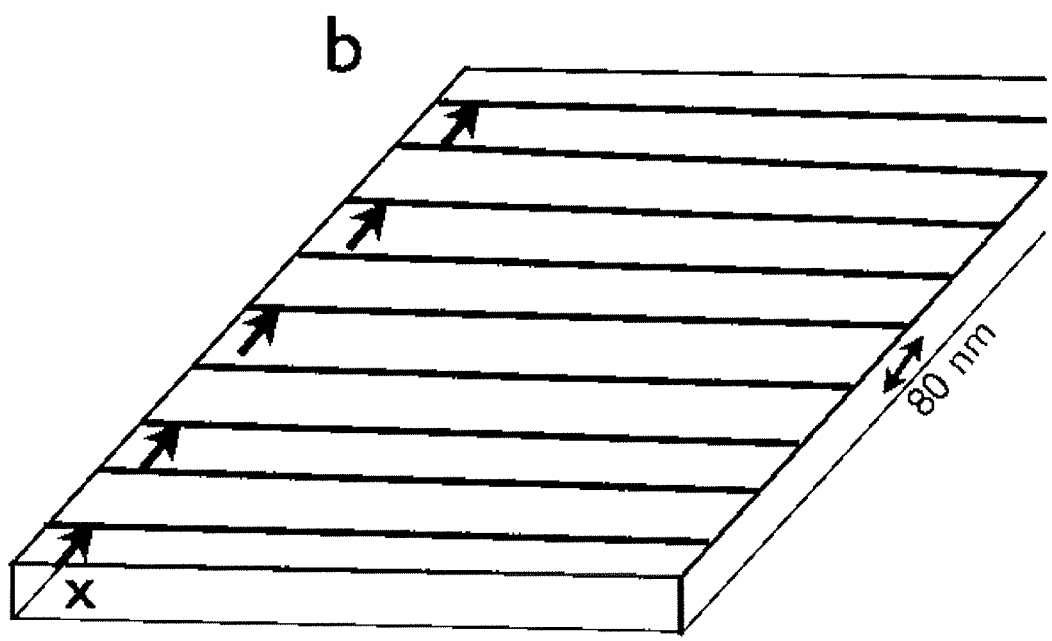
FIG. 8b is exemplary diagram of an embodiment of parallel magnetization.
Figure 8C:
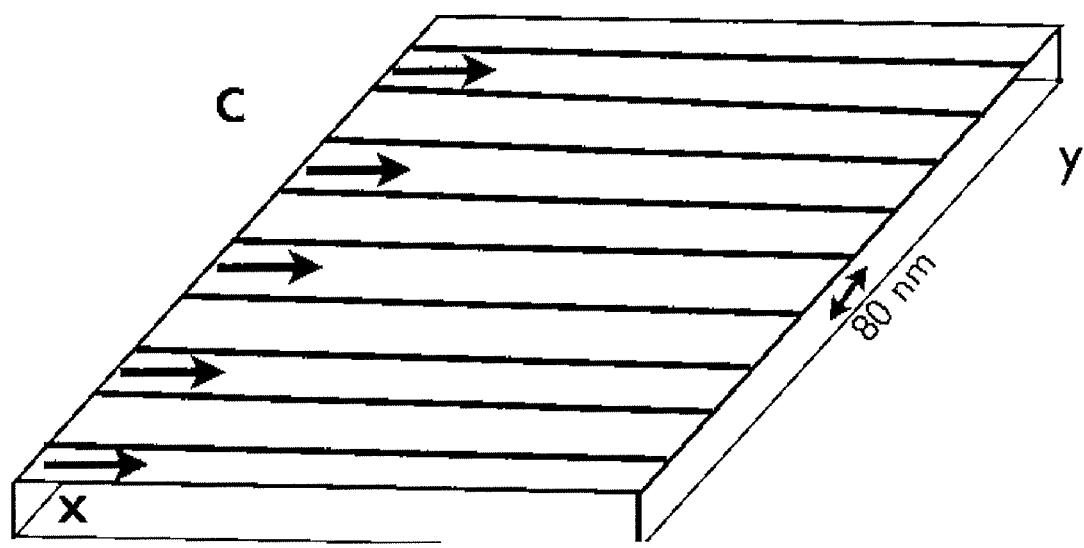
FIG. 8c is exemplary diagram of an embodiment of parallel magnetization.

In the examples shown in FIGS. 8a, 8b, and 8c, the magnetic material is arranged in a plurality of stripes. Each stripe has a length and a width, where the length of the stripe is a greater distance than the width of the stripe. In the examples shown in FIGS. 8a, 8b, and 8c, the width of the stripes is approximately 80 nm. This is only an example; the width of the stripes is not limited to the width shown in the examples. Parallel (in plane) magnetization against (approximately perpendicular to) stripes of magnetic material means that the magnetic domains are magnetized approximately parallel to a surface of the magnetic film and approximately perpendicularly to a length of the magnetic film. Parallel (in plane) magnetization with (approximately parallel to) stripes of magnetic material means that the magnetic domains are magnetized approximately parallel to a surface of the magnetic film and approximately parallel to a length of the magnetic film.

Figure 9:
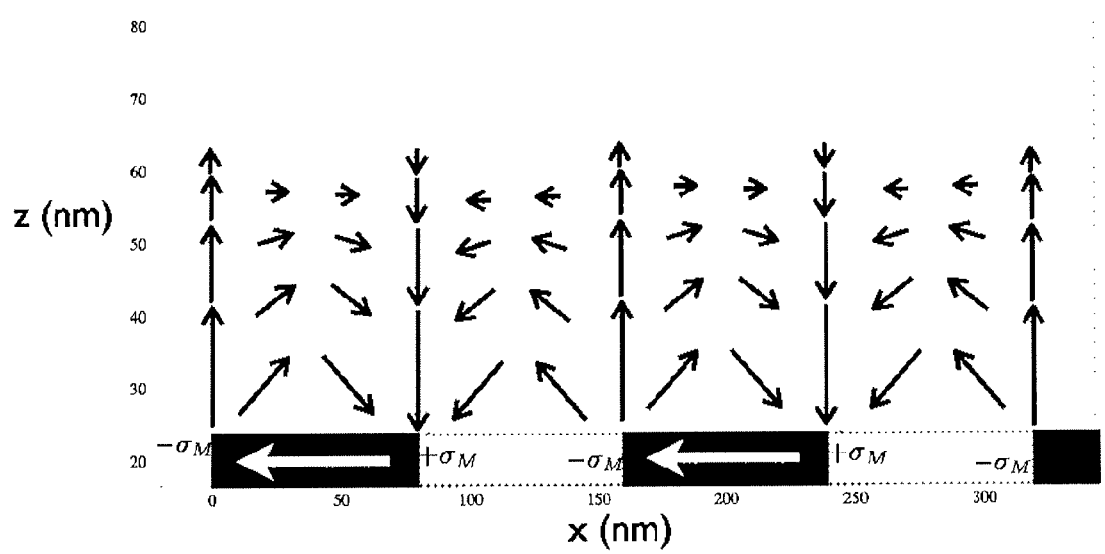
FIG. 9 is exemplary diagram of fringe fields above the magnetic film.

A qualitative picture calculated for the exemplary configuration shown in FIG. 8b is shown in FIG. 9. FIG. 9 shows a side view of the example of FIG. 8b and shows fringe fields above the magnetic film. $\sigma_M$ is the "magnetic surface charge density" which is a construct that is related to the size of the magnetization. Fringe fields are shown to vary both in the x and z directions. The changing fringe fields as a function of space shows that parallel magnetized films may also yield useful magnetoelectroluminescent effects.

Figure 10:
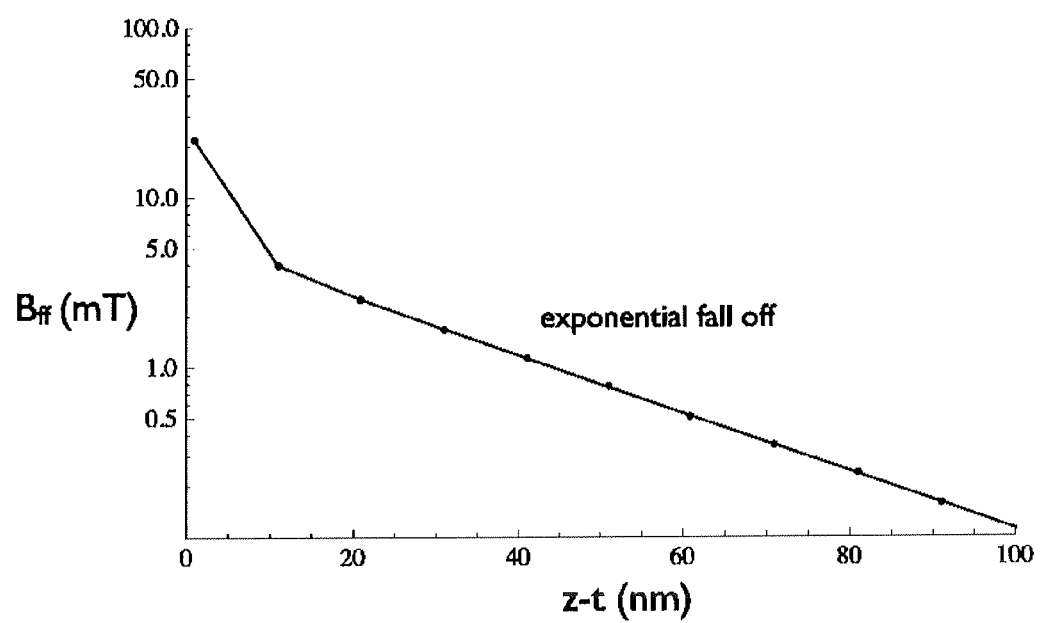
FIG. 10 is exemplary diagram of fringe field magnitude as a function of distance above magnetic film.

FIG. 10 shows a quantitative understanding of the fringe field behavior in terms of fringe field magnitude as a function of distance above magnetic film, z-t, for the example shown in FIG. 8b. The example of FIG. 10 shows that near the edge of a domain, the fringe field falls off exponentially above the magnetic film. First, this indicates that the active organic layer cannot be too distant from the field or the fringe fields will be negligible. Secondly, the sharp fall of fringe fields ensures that the gradient of the fringe fields is relatively large, which gives rise to significant sensitivity in the organic layer to the magnetic domain orientations. In addition, the fringe fields also vary periodically in the x-direction, as shown in FIG. 9.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A display device comprising a plurality of pixels, each pixel comprising:
    an organic light emitting diode;
    an organic field-effect transistor controlling current flow through the organic light emitting diode;
    a ferromagnetic film arranged adjacent to the organic field-effect transistor so that fringe magnetic fields of magnetic domains in the ferromagnetic film penetrate the organic field-effect transistor and cause the current flow from the organic field-effect transistor to vary based on a strength of the fringe magnetic fields, whereby an optical signal from the organic light emitting diode is varied.

2. The device of claim 1, further comprising circuitry to write the magnetic domains in the ferromagnetic film.

3. The device of claim 1, wherein the magnetic domains in the ferromagnetic film are magnetized perpendicularly to a plane of the ferromagnetic film.

4. The device of claim 1, wherein the magnetic domains in the ferromagnetic film are magnetized parallel to a plane of the ferromagnetic film.

5. The device of claim 1, wherein the ferromagnetic film comprises at least one stripe having a length and a width, wherein the length is greater than the width, and the magnetic domains in the ferromagnetic film are magnetized parallel to a plane of the ferromagnetic film and perpendicularly to the length of the at least one stripe.

6. The device of claim 1, wherein the ferromagnetic film comprises at least one stripe having a length and a width, wherein the length is greater than the width, and the magnetic domains in the ferromagnetic film are magnetized parallel to a plane of the ferromagnetic film and parallel to the length of the at least one stripe.

* * * * *